US 7,952,883 B2
May 31, 2011

(12) United States Patent
Hidaka

(10) Patent No.: US 7,952,883 B2
(45) Date of Patent: May 31, 2011

(54) ELECTRONIC APPARATUS AND IN-RACK ELECTRONIC APPARATUS

(75) Inventor: Hiroshi Hidaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 666 days.

(21) Appl. No.: 11/905,841

(22) Filed: Oct. 4, 2007

(65) Prior Publication Data

US 2008/0135503 A1    Jun. 12, 2008

(30) Foreign Application Priority Data

Dec. 8, 2006    (JP) ................ 2006-332206

(51) Int. Cl.
*H05K 5/00*    (2006.01)
*H05K 7/16*    (2006.01)

(52) U.S. Cl. ..... 361/726; 361/727; 361/724; 312/223.1; 312/223.2

(58) Field of Classification Search ............... 361/678, 361/679.49, 679.5, 679.51, 679.52, 679.53, 361/679.54, 688–728, 679.01–679.45; 454/184, 454/186; 312/223.1–223.3, 236; 174/16.1–16.3
See application file for complete search history.

(56) References Cited

U.S. PATENT DOCUMENTS

| | | | | |
|---|---|---|---|---|
| 6,021,047 | A * | 2/2000 | Lopez et al. | 361/727 |
| 6,070,742 | A * | 6/2000 | McAnally et al. | 211/26 |
| 2005/0035262 | A1* | 2/2005 | Seki et al. | 248/441.1 |
| 2005/0174724 | A1* | 8/2005 | Chen | 361/681 |
| 2006/0028804 | A1 | 2/2006 | Hidaka | |
| 2006/0028805 | A1 | 2/2006 | Hidaka | |
| 2008/0002362 | A1 | 1/2008 | Ishimine | |

FOREIGN PATENT DOCUMENTS

| | | |
|---|---|---|
| JP | 60-9279 | 1/1985 |
| JP | 61-53984 | 4/1986 |
| JP | 4-35624 | 3/1992 |
| JP | 11-155646 | 6/1999 |
| JP | 2000-68664 | 3/2000 |
| JP | 2000-106494 | 4/2000 |
| JP | 2002-176275 | 6/2002 |
| JP | 3108772 | 2/2005 |
| JP | 2006-294201 | 10/2006 |
| WO | 2006/103731 A1 | 10/2006 |

OTHER PUBLICATIONS

Japanese Office Action mailed Jun. 9, 2009 and issued in corresponding Japanese Patent application 2006-332206, Partial.

\* cited by examiner

*Primary Examiner* — Robert J Hoffberg
*Assistant Examiner* — Jerry Wu
(74) *Attorney, Agent, or Firm* — Staas & Halsey LLP

(57) ABSTRACT

A first swinging member is connected to a rack mount unit for swinging movement around a first horizontal axis. A second swinging member is connected to a rack for swinging movement around a second horizontal axis. The second swinging member is coupled to the first swinging member around a third horizontal axis extending in parallel with the first horizontal axis. The rack mount unit is pulled out forward from the rack along a horizontal plane. The first horizontal axis follows the forward movement of the rack mount unit. The second horizontal axis is prevented from moving, since the second horizontal axis is connected to the rack. The first and second swinging members expand around the third horizontal axis. The holding members of the first and second swinging members hold a wire on the first and second swinging members. The wire is thus prevented from tangling.

5 Claims, 15 Drawing Sheets

ELECTRONIC APPARATUS AND IN-RACK ELECTRONIC APPARATUS

BACKGROUND OF THE INVENTION

1. Field of the Invention

The present invention relates to a rack mount type electronic apparatus, such as a disk array apparatus.

2. Description of the Prior Art

In general, a rack is designed to form a cabinet having a width identical to the width of the rack. When a rack mount type electronic apparatus is housed in the cabinet, the rack mount type electronic apparatus extends at the full width of the cabinet in the horizontal direction. A hard disk drive, HDD, is pulled out of and inserted into the top of the rack mount type disk array apparatus in the vertical direction, for example.

A first arm is attached to the rear surface of an enclosure for swinging movement around a first vertical axis in the disk array apparatus. A second arm is attached to the first arm for swinging movement around a second vertical axis extending in parallel with the first vertical axis. The second arm is coupled to the rack for a swinging movement around a third vertical axis extending in parallel with the first vertical axis. The first and second arms are designed to bind a plural of wires extending from the disk array apparatus. When the disk array apparatus is mounted on the rack, the first and second arms are folded. When the disk array apparatus is pulled out forward from the rack, the first and second arms are unfolded around the second vertical axis. The first and second arms serve to prevent the wires from entangling.

The rack has a height equal to 1,800 mm approximately, for example. When the hard disk drive is to be replaced in the uppermost disk array apparatus, for example, a maintenance worker must work at a higher location from the floor. If the disk array apparatus is allowed to establish the vertical attitude, the hard disk drive is pulled out of and inserted into the disk array apparatus along the horizontal plane. The maintenance worker is able to replace a hard disk drive easier than ever. It is desirable for a disk array apparatus to establish the vertical attitude.

SUMMARY OF THE INVENTION

It is accordingly an object of the present invention to provide an electronic apparatus and an in-rack electronic apparatus capable of establishing a vertical attitude without causing the entangling of wires.

According to the present invention, there is provided an electronic apparatus comprising: a rack mount unit housed in a rack for forward movement along a horizontal plane, the forward movement enabling the rack mount unit to be pulled out of the rack; a first swinging member connected to one of the rack mount unit and the rack for swinging movement around a first horizontal axis, the first swinging member extending in the direction of gravity at the back of the rack mount unit; a second swinging member connected to other of the rack mount unit and the rack for swinging movement around a second horizontal axis, the second horizontal axis aligned with the first horizontal axis when the rack mount unit is housed in the rack, the second swinging member extending in the direction of the gravity at the back of the rack mount unit, the second swinging member connected to the first swinging member for swinging movement around a third horizontal axis extending in parallel with the first horizontal axis at a position distanced from the first horizontal axis; a wire connected to the rack mount unit; holding members respectively received on the first and second swinging members to hold the wire on the first and second swinging members; and a locking mechanism designed to hold the second swinging member at a predetermined rotation angle position around the second horizontal axis when the rack mount unit is housed in the rack.

The electronic apparatus is designed to establish a vertical attitude. The first swinging member is connected to the rack mount unit, for example, for swinging movement around the first horizontal axis. The second swinging member is connected to the rack, for example, for swinging movement around the second horizontal axis. The second swinging member is coupled to the first swinging member around the third horizontal axis extending in parallel with the first horizontal axis. The rack mount unit is pulled out forward from the rack along the horizontal plane. The first horizontal axis is pulled out forward along with the rack mount unit, since the first horizontal axis is established on the rack mount unit. The second horizontal axis is prevented from moving, since the second horizontal axis is established on the rack. As the first horizontal axis gets distanced from the second horizontal axis, the first and second swinging members expand around the third horizontal axis. The holding members hold the wire on the first and second swinging members. The wire is thus prevented from tangling. Similarly, the wire is prevented from tangling when the rack mount unit is inserted into the rack.

When the rack mount unit is housed in the rack, the first and second swinging members extend at the back of the rack mount unit in the direction of gravity. The locking mechanism is designed to hold the second swinging member at a predetermined rotation angle position around the second horizontal axis. The locking mechanism is allowed to hold the first swinging member along with the second swinging member at a predetermined rotation angle position, since the first and second rotation members are connected to each other at the third horizontal axis. For example, it is unnecessary for a maintenance worker to support the first and second swinging members with a hand. Moreover, the rack mount unit exposes its back surface. The wire is prevented from tangling. As a result, the maintenance worker is able to easily perform the maintenance at the back of the rack mount unit.

The locking mechanism may further comprise a stop member attached to one of the rack mount unit and the rack for engagement with the second swinging member. The electronic apparatus may also further comprise a first engagement section defined on the second swinging member for engagement with the stop member, the first engagement section designed to hold the second swinging member at an angle smaller than 135 degrees from the direction of gravity around the second horizontal axis; and a second engagement section defined on the second swinging member for engagement with the stop member, the second engagement section designed to hold the second swinging member at an angle larger than 135 degrees from the direction of the gravity around the first horizontal axis. The first and second engagement sections may be selected based on the elevation of the rack mount unit. The angle may be set smaller if the rack mount unit is supported at a higher elevation. Accordingly, the stop member may engage the first engagement section.

The electronic apparatus may further comprise a lock releasing lever attached to the second swinging member for relative movement, the lock releasing lever contacting the stop member based on the relative movement so as to release the engagement between the first engagement section and the stop member and/or the engagement between the second engagement section and the stop member. The lock releasing lever serves to easily release the engagement between the first engagement section and the stop member as well as between the second engagement section and the stop member. The electronic apparatus may be incorporated in an electronic apparatus assembly unit, for example.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
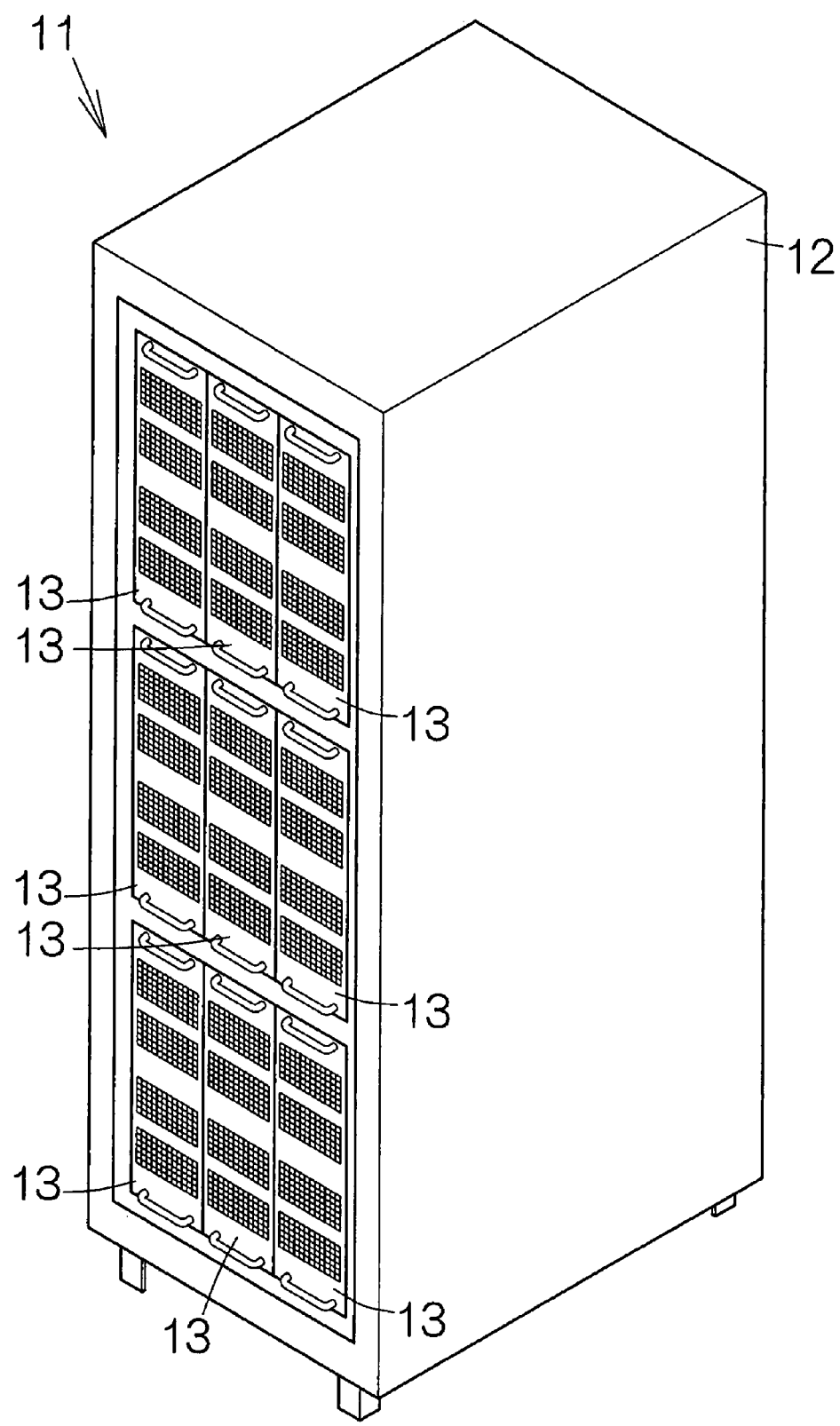
FIG. 1 is a perspective view schematically illustrating a disk array unit as an example of an in-rack electronic apparatus according to the present invention.

FIG. 1 schematically illustrates a disk array unit 11 as an electronic apparatus array unit or an in-rack electronic apparatus according to the present invention. The disk array unit 11 includes a rack 12. Electronic apparatuses or disk array apparatuses 13 are mounted on the rack 12. The disk array apparatuses 13 stand in a vertical attitude. The individual disk array apparatus 13 is connected to an upper host such as a server computer mounted on another rack, not shown. The disk array apparatuses 13 are allowed to operate based on instructions supplied from the server computer.

Figure 2:
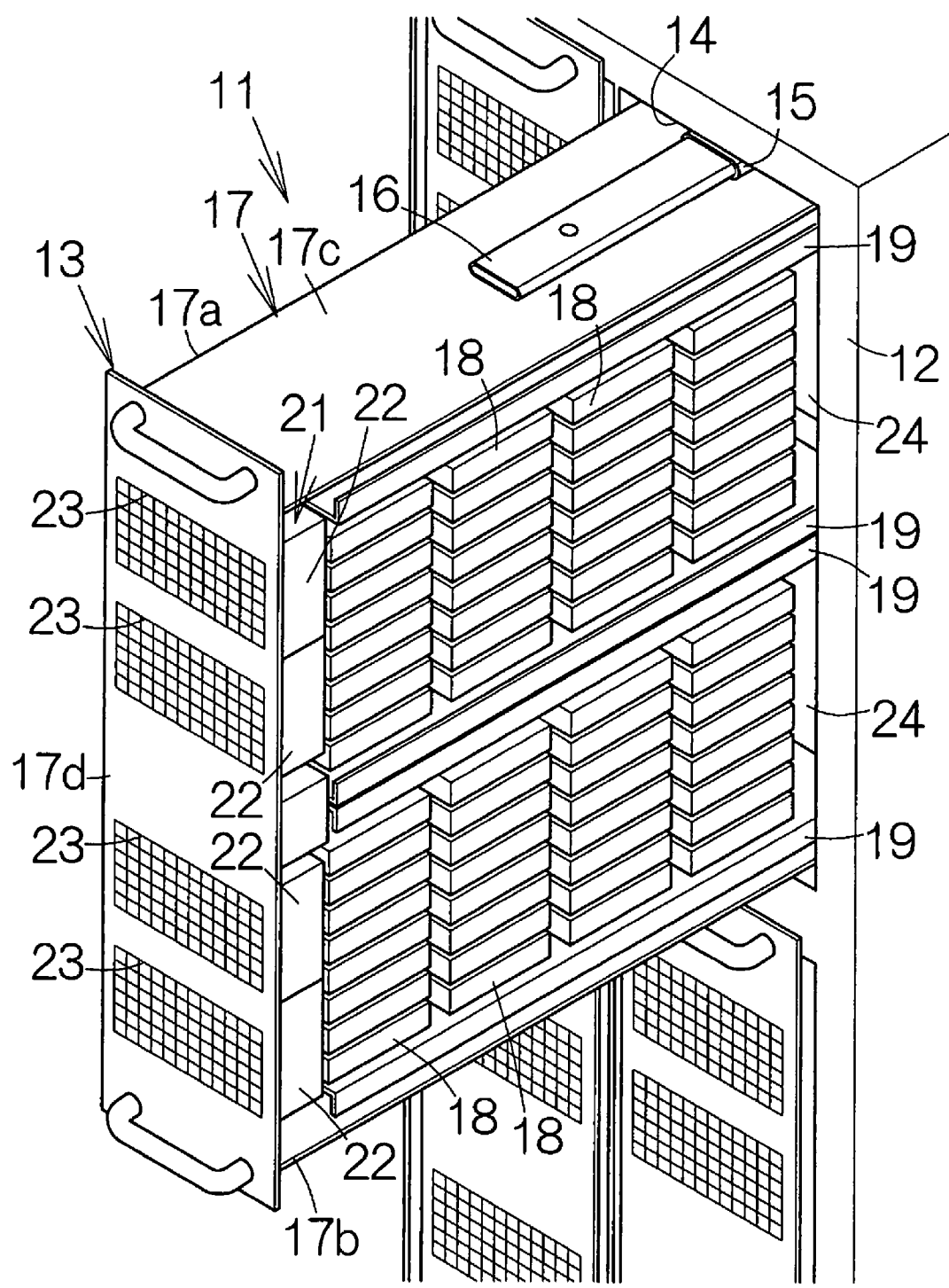
FIG. 2 is a perspective view schematically illustrating the structure of a disk array apparatus as an example of an electronic apparatus according to the present invention.

As shown in FIG. 2, the rack 12 includes a cabinet 14 designed to house the disk array apparatuses 13. A pair of guide members 15, 15 is attached to the upper and lower ends of the cabinet 14. The guide member 15 is designed to extend in the back-and-forth direction of the rack 12 along a horizontal plane. The guide members 15 support corresponding support members 16 attached to the upper and lower ends of the disk array apparatus 13. The combination of the guide members 15 and the support members 16 enables the disk array apparatus 13 to be pulled out forward from the cabinet 14 along a horizontal plane.

A rack mount unit 17 is attached to the support members 16. The rack mount unit 17 includes a side plate 17a extending along a vertical plane. A bottom plate 17b and a top plate 17c are designed to stand from the side edges of the side plate 17a. The bottom plate 17b and the top plate 17c extend in parallel with each other in horizontal planes. The support members 15 are attached to the bottom plate 17b and the top plate 17c, respectively. A front panel 17d is defined in the front of the rack mount unit 17. The side plate 17a, the bottom plate 17b, the top plate 17c and the front panel 17d in combination serve to define an inner space of the rack mount unit 17.

Sixty-four storage medium drives or hard disk drives, HDDs, are housed in the inner space of the rack mount unit 17, for example. The individual HDD 18 is designed to lie in a horizontal attitude. The HDDs 18 can be pulled out of and inserted into the rack mount unit 17 along a horizontal plane. Four interface units 19 are housed in the inner space. The interface units 19 receive instructions of writing and reading operation supplied from the server computer. The interface units 19 are designed to distribute the instructions to the corresponding HDDs 18.

Air-intake units 21 are attached to the side plate 17a of the rack mount unit 17. The air-intake unit 21 includes four ventilation fans 22, for example. The individual ventilation fan 22 is opposed to an air-intake aperture 23 defined in the front panel 17d. The air-intake units 21 serve to generate airflow running through the inner space of the rack mount unit 17 from the front of the rack mount unit 17. The introduced air efficiently cools the HDDs 18 and the interface units 19. The HDDs 18 and the interface units 19 can thus be prevented from an excessive rise in the temperature.

Two printed circuit boards, not shown, are housed in the inner space of the rack mount unit 17, for example. The printed circuit boards are received on the side plate 17a of the rack mount unit 17. The HDDs 18 and the interface units 19 are mounted on the printed circuit boards. The printed circuit boards are respectively connected to power source units 24 housed in the inner space of the rack mount unit 17. The power source units 24 are supported on the side plate 17a of the rack mount unit 17, for example. The power source units 24 serve to supply electric power to the individual HDD 18.

Figure 3:
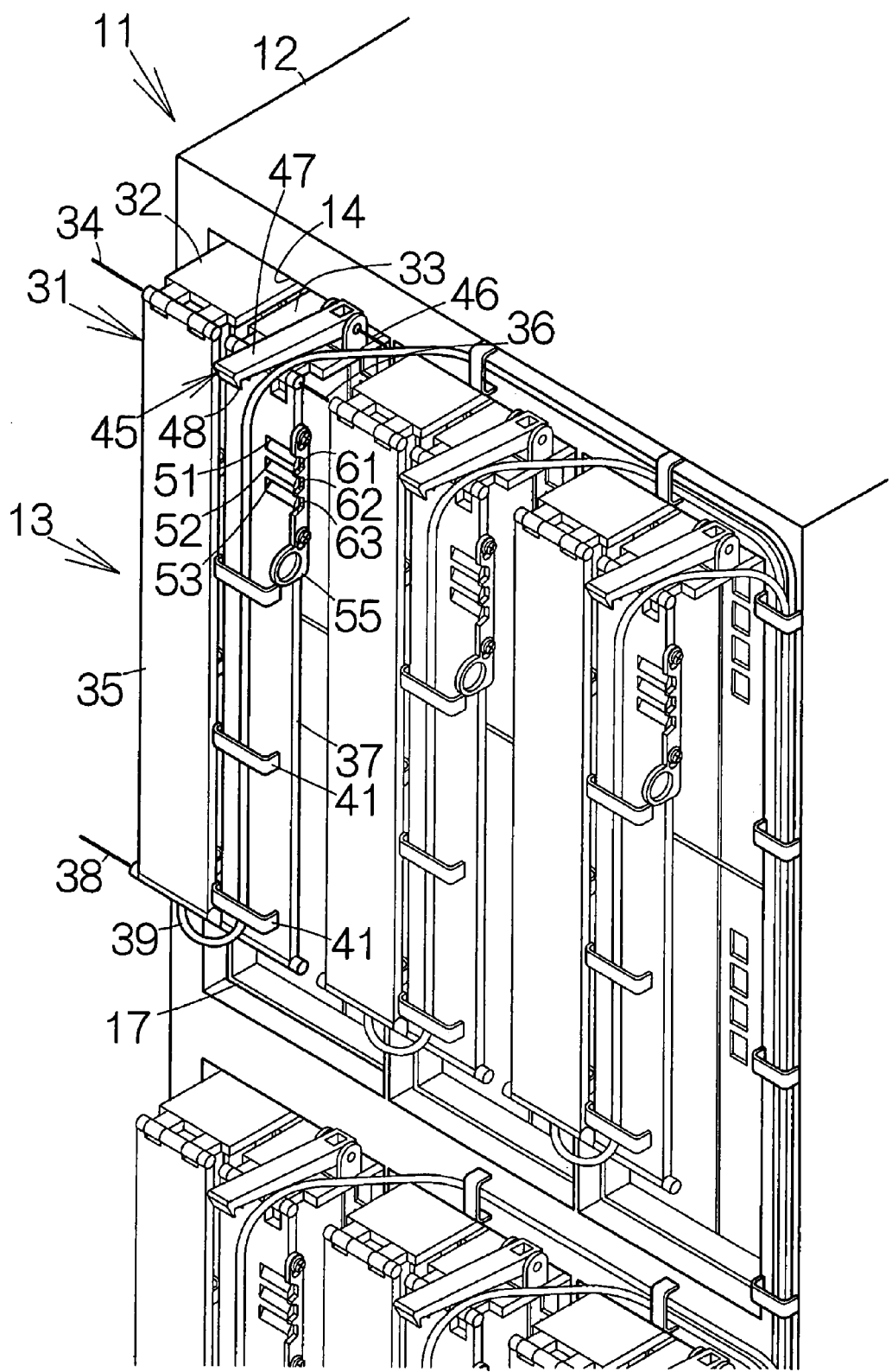
FIG. 3 is an enlarged partial perspective view schematically illustrating the back of the disk array unit.

As shown in FIG. 3, the individual disk array apparatus 13 includes an arm mechanism 31 located at the back of the rack mount unit 17. The arm mechanism 31 includes first and second fixed members 32, 33 extending along a horizontal plane. The first fixed member 32 is fixed to the top plate 17c of the rack mount unit 17. The second fixed unit is fixed to the top end of the cabinet 14. A screw or screws may be utilized to fix the first and second fixed members 32, 33. The first and second fixed members 32, 33 are designed to extend backward from the rack mount unit 17.

A first swinging member 35 is attached to the first fixed member 32. The first swinging member 35 has one end coupled to the outer end of the first fixed member 32 for swinging movement around a first horizontal axis 34. The first swinging member 35 is designed to extend in the direction of gravity at the back of the rack mount unit 17. A second swinging member 37 is likewise connected to the second fixed member 33. The second swinging member 37 has one end coupled to the outer end of the second fixed member 33 for swinging movement around a second horizontal axis 36. The second swinging member 37 is designed to extend in the direction of gravity at the back of the rack mount unit 17. When the rack mount unit 17 is completely housed in the cabinet 14, the second horizontal axis 36 is aligned with the first horizontal axis 34 on a common straight line.

The second swinging member 37 is coupled to the first swinging member 35 for swinging movement around a third horizontal axis 38 extending in parallel with the first horizontal axis 34. The third horizontal axis 38 is distanced away from the first horizontal axis 34 by a certain distance. The third horizontal axis 38 is defined at the other end of the first and second swinging members 35, 37. When the rack mount unit 17 is completely housed in the cabinet 14, the first and second swinging members 35, 37 are allowed to oppose its inside surfaces to the back surface of the rack mount unit 17, respectively.

Wire 39 is connected to the rack mount unit 17. Holding members or hooks 41 are coupled to the first and second swinging members 35, 37 to hold the wire 39 on the first and second swinging members 35, 37. The hooks 41 are formed integral on the inner surface of the first swinging member 35 and the outer surface of the second swinging member 37, respectively. The wire 39 is designed to extend along the inner surface of the first swinging member 35 from the rack mount unit 17 to turn around the third horizontal axis 38. The wire 39 keeps extending along the outer surface of the second swinging member 37 from the third horizontal axis 38. The wire 39 further extends along the rear surface of the rack 12. The wire 39 serves to electrically connect the power source units 24 or the interface units 19 to the server computer.

Figure 4:
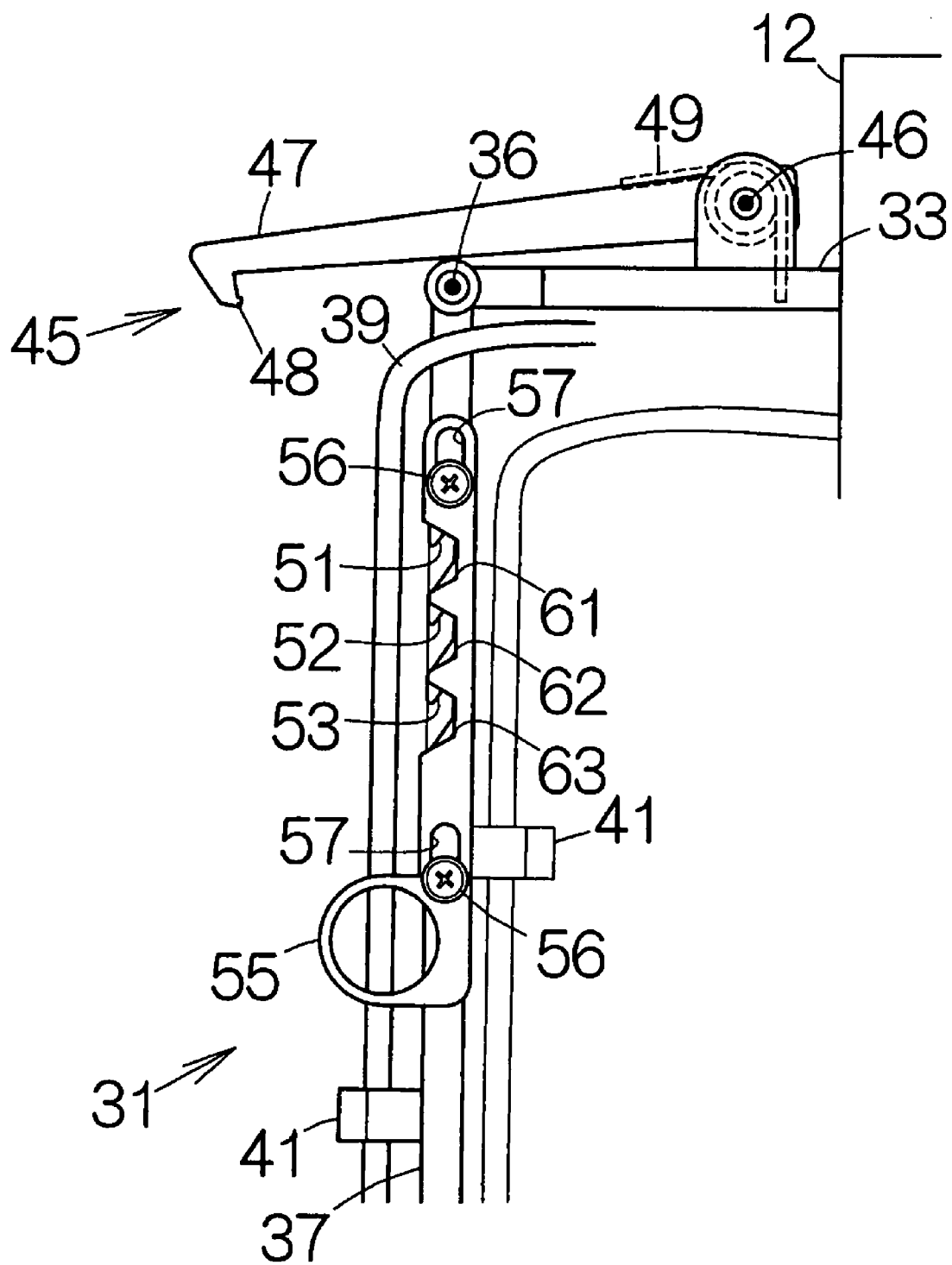
FIG. 4 is an enlarged partial side view schematically illustrating the structure of a locking mechanism with a lock releasing lever at a predetermined lock position.

The arm mechanism 31 includes a locking mechanism 45. The locking mechanism 45 includes a stop member 47. The stop member 47 is coupled to the second fixed member 33 for swinging movement around a fourth horizontal axis 46 extending in parallel with the first horizontal axis 34. A hook 48 is defined at the tip end of the stop member 47. Referring also to FIG. 4, a torsion coil spring 49 is wound around a shaft providing the fourth horizontal axis 46. The torsion coil spring 49 serves to exert moment to the stop member 47 around the fourth horizontal axis 46. The stop member 47 is urged toward the second fixed member 33 around the fourth horizontal axis 46.

The locking mechanism 45 includes a first, second and third engagement sections, namely first, second and third grooves 51, 52, 53 defined on the outer surface of the second swinging member 37. The first, second and third grooves 51, 52, 53 extend in parallel with the second horizontal axis 36, respectively. The first groove 51 is located nearest to the second horizontal axis 36. The third groove 53 is located farthest from the second horizontal axis 36. One ends of the first, second and third grooves 51, 52, 53 are opened at the side surface of the second swinging member 37. The first, second and third grooves 51, 52, 53 respectively form an inclined inside surface extending within an inclined plane that gets closer to the second horizontal axis 36 as the depth gets larger in the first, second and third grooves 51, 52, 53, respectively, as described later in detail. This inclined plane is established at a predetermined angle from a tangent plane tangential to an imaginary cylindrical surface having the central axis on the fourth horizontal axis 46.

The locking mechanism 45 includes a lock releasing lever 55 attached to the side surface of the second swinging member 37 for relative movement. Screws 56 are utilized to attach the lock releasing lever 55, for example. The screws 56 are received in elongated apertures 57 of the lock releasing lever 55, respectively. The elongated apertures 57 serve to guide the movement of the screws 56, namely the movement of the lock releasing lever 55 along the longitudinal direction of the second swinging member 37. The lock releasing lever 55 is allowed to move between a predetermined lock position and a predetermined release position. A coil spring, not shown, serves to exert an elastic force to the lock releasing lever 55 toward the lock position. The elastic force forces the lock releasing lever to stay at the lock position.

First, second and third recesses 61, 62, 63 are formed on the lock releasing lever 55. The first, second and third recesses 61, 62, 63 are respectively related to the first, second and third grooves 51, 52, 53. The first recess 61 is located nearest to the second horizontal axis 36. The third recess 63 is located farthest from the second horizontal axis 36. The first, second and third recesses 61, 62, 63 respectively form an inclined inside surface extending along an inclined plane that gets farther from the second horizontal axis 36 as the depth increases in the first, second and third grooves 51, 52, 53, as described later in detail. This inclined plane is established at a predetermined angle from a tangent plane tangential to an imaginary cylindrical surface having the central axis on the fourth horizontal axis 46.

Figure 5:
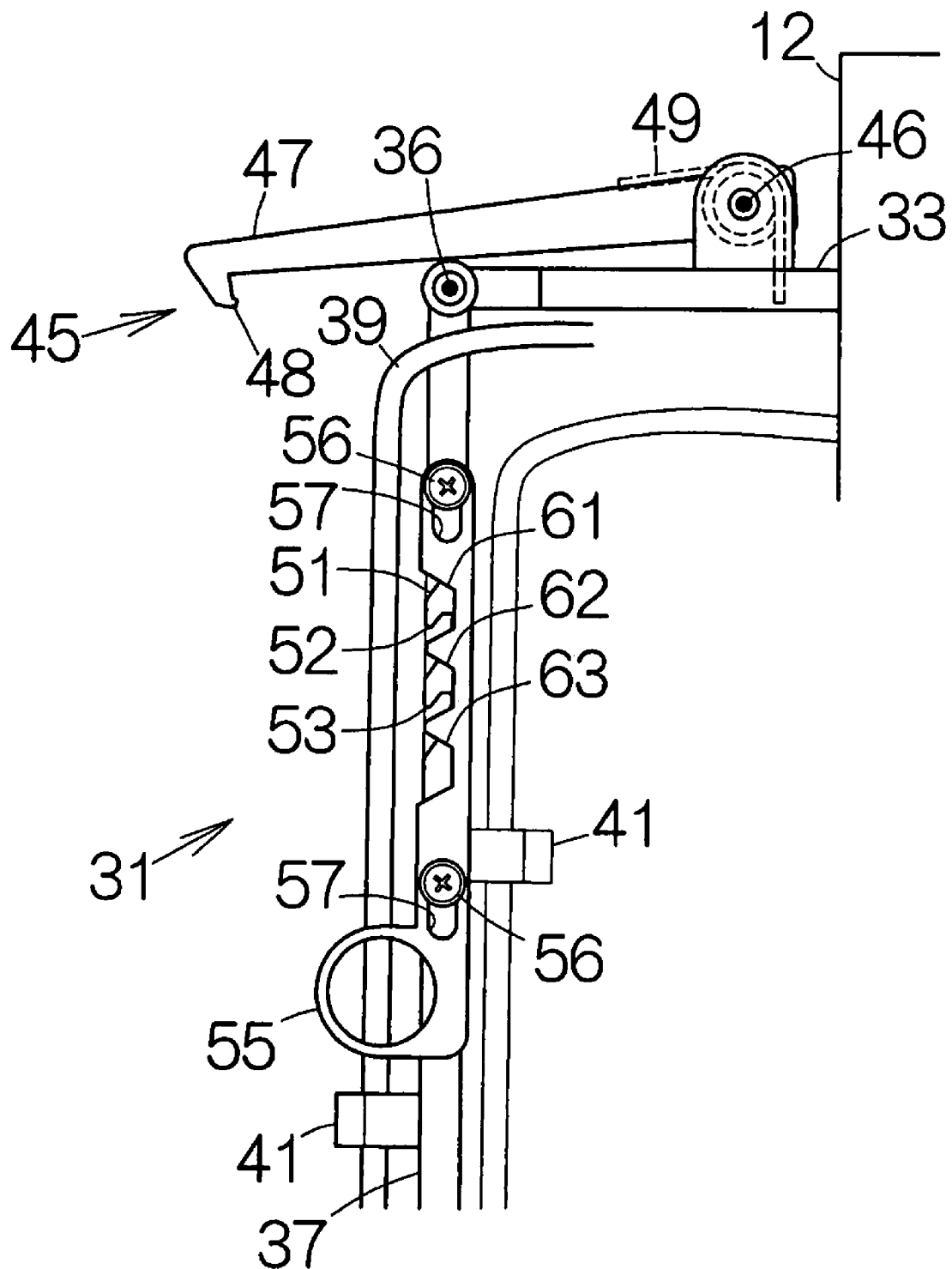
FIG. 5 is an enlarged partial side view schematically illustrating the structure of the locking mechanism with the lock releasing lever at a predetermined release position.

When the lock releasing lever 55 is positioned at the lock position, the first, second and third recesses 61, 62, 63 are respectively aligned with the ends of the first, second and third grooves 51, 52, 53. The ends of the first, second and third grooves 51, 52, 53 stand open. On the other hand, when the lock releasing lever 55 moves from the lock position to the release position, the inclined inside surfaces of the first, second and third recesses 61, 62, 63 move across the openings of the first, second and third grooves 51, 52, 53, respectively, as shown in FIG. 5. The lock releasing lever 55 at the release position closes the ends of the first, second and third grooves 51, 52, 53.

Now, assume that a maintenance worker performs maintenance of the disk array apparatus 13. The rack mount unit 17 is pulled out forward from the cabinet 14 along a horizontal plane with the assistance of the guide members 15 and the support members 16. The first fixed member 32 moves forward along with the rack mount unit 17, since the first fixed member 32 is coupled to the rack mount unit 17. The second fixed member 33 is prevented from moving, since the second fixed member 33 is coupled to the cabinet 14.

Figure 6:
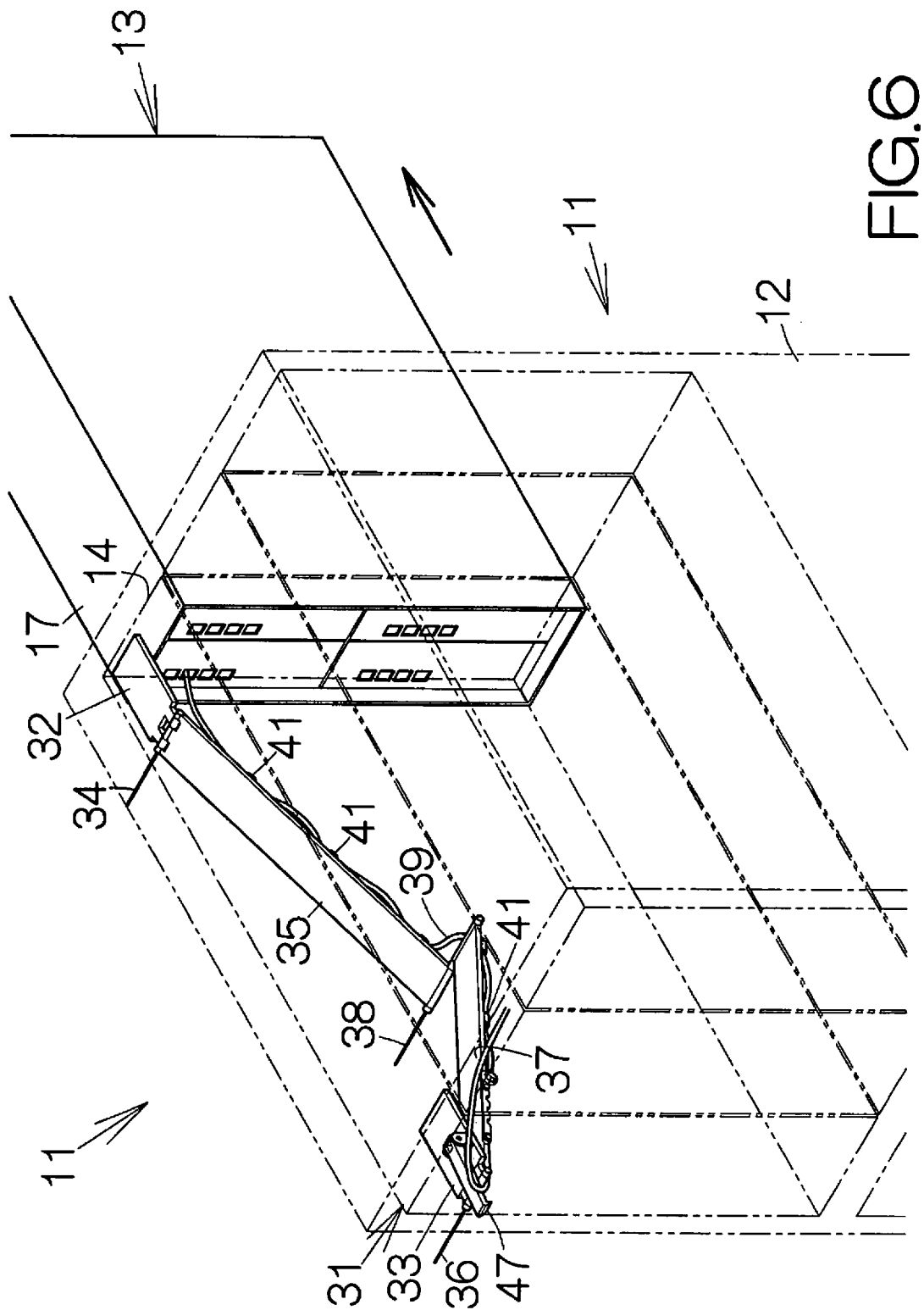
FIG. 6 is an enlarged partial perspective view schematically illustrating the disk array apparatus pulled out of the rack.

As shown in FIG. 6, the first and second swinging members 35, 37 are allowed to expand around the third horizontal axis 38. The first swinging member 35 swings around the first horizontal axis 34. The second swinging member 37 likewise swings around the second horizontal axis 36. The first and second swinging members 35, 37 are positioned at predetermined rotation angle in a space between the first and second fixed members 32, 33. The inner surface of the first swinging member 24 and the outer surface of the second swinging member 37 get opposed to the ceiling of the cabinet 14. The hooks 41 keep holding the wire 39.

As shown in the aforementioned FIG. 2, the HDDs 18 can be pulled out of and inserted into the rack mount unit 17 along a horizontal plane. The maintenance worker performs replacement of the HDDs 18. The hooks 41 serve to hold the wire 39 on the first and second swinging members 35, 37 behind the rack mount unit 17. When the rack mount unit 17 is inserted into the cabinet 14, the wire 39 is reliably prevented from tangling at the back of the rack mount unit 17. The rack mount unit 17 can smoothly be inserted into the cabinet 14.

Figure 7:
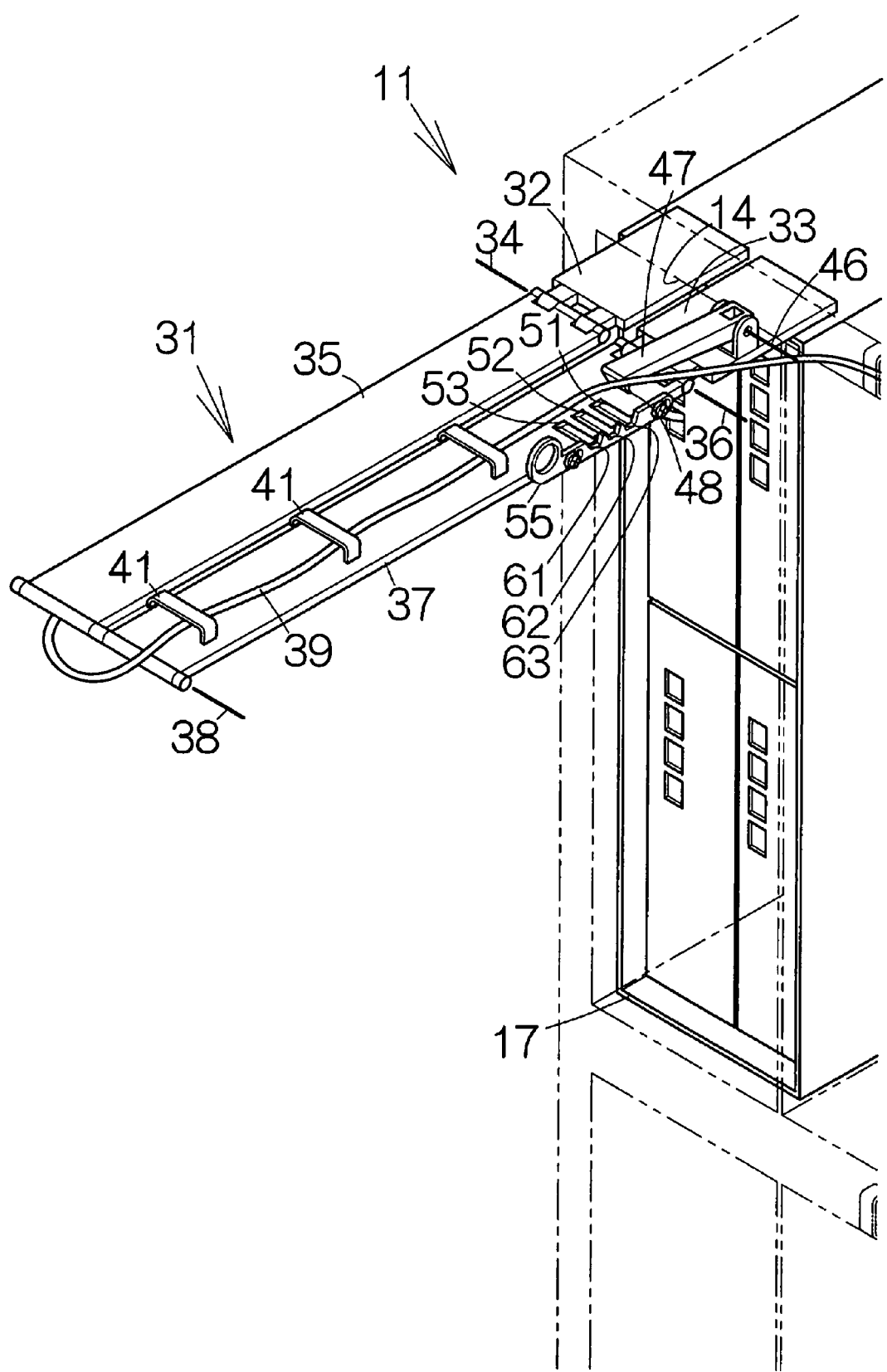
FIG. 7 is an enlarged partial perspective view schematically illustrating first and second swinging members lifted up around first and second horizontal axis.

Next, assume that a maintenance worker performs maintenance at the back of the disk array apparatus 13. The rack mount unit 17 is kept housed in the cabinet 14. As shown in FIG. 7, when a maintenance worker lifts up the first and second swinging members 35, 37, the first and second swinging members 35, 37 swing from the direction of gravity around the first and second horizontal axes 34, 36 coaxial to each other. As the first and second swinging members 35, 37 swing from the direction of gravity, the hook 48 of the stop member 47 approaches the first groove 51.

Figure 8:
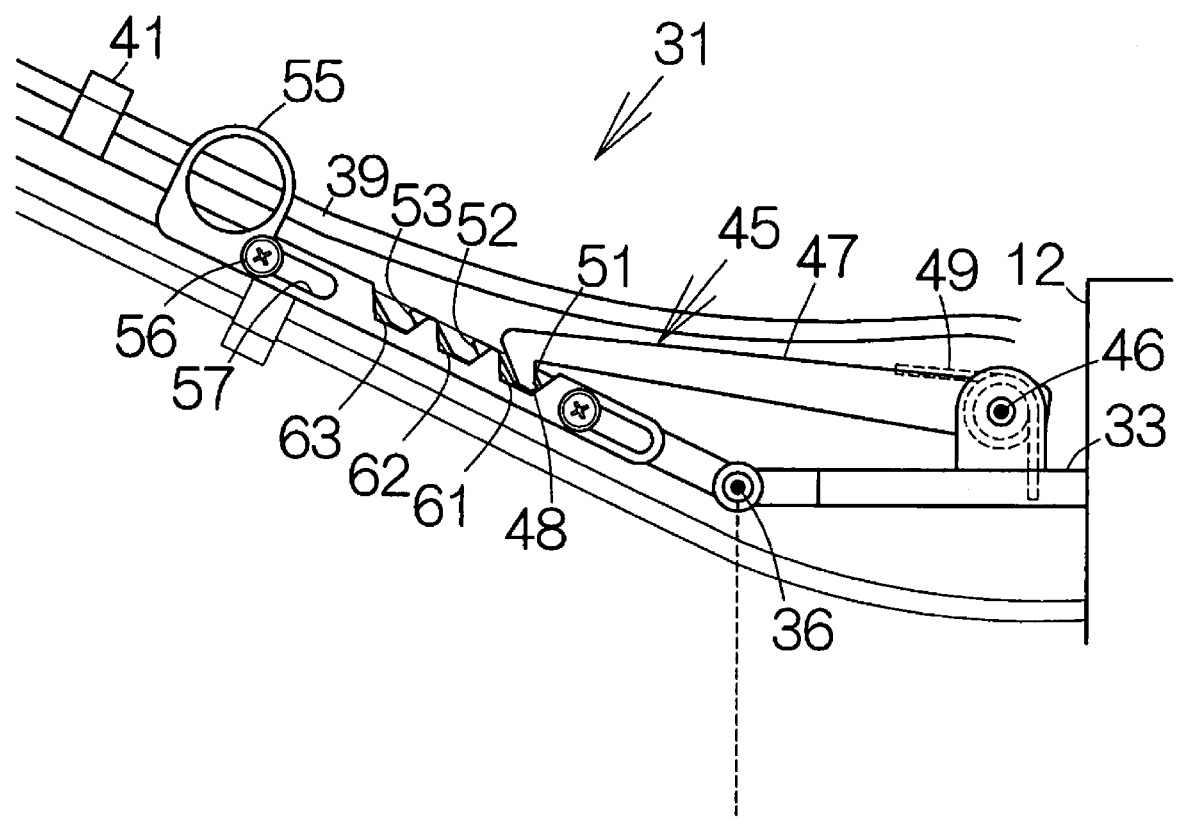
FIG. 8 is an enlarged partial side view schematically illustrating a stop member engaging with an engagement section.

When the first and second swinging members 35, 37 swing over a predetermined rotation angle around the first and second horizontal axes 34, 36, the hook 48 is received in the first groove 51 and the first recess 61, as shown in FIG. 8. The stop member 47 holds the second swinging member 37 at a first rotation angle position. The first swinging member 35 is also kept at the first rotation angle position, since the first swinging member 35 is coupled to the second swinging member 37 at the third horizontal axis 38. The rotation angle of the first and second swinging members 35, 37 may be set at an angle smaller than 135 degrees from the direction of gravity. Here, the rotation angle is set at 115 degrees, for example.

Figure 9:
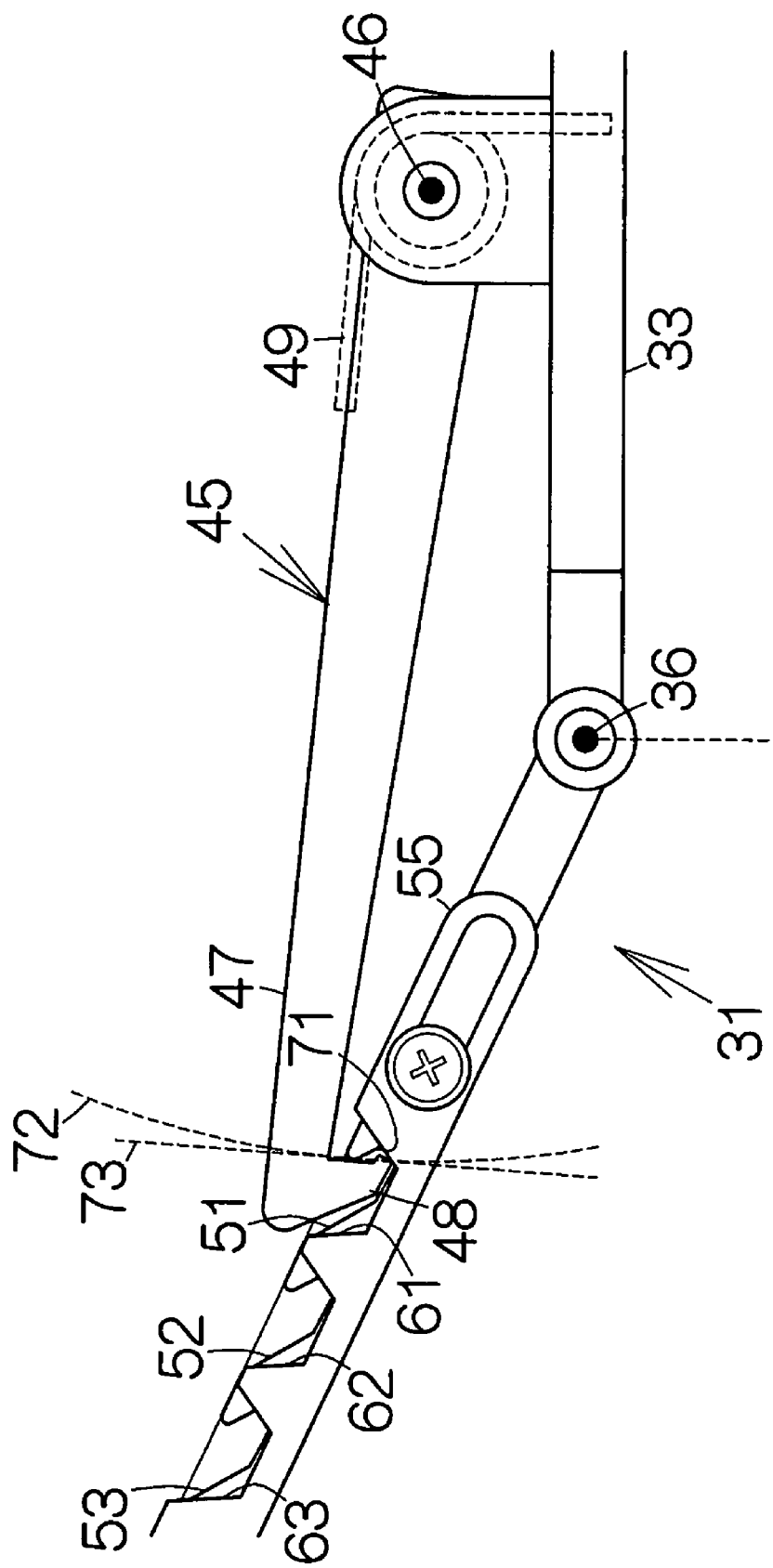
FIG. 9 is a further enlarged partial side view schematically illustrating the stop member engaging with the engagement section.

The first, second and third grooves 51, 52, 53 respectively form the inclined inside surface extending within an inclined plane that gets closer to the second horizontal axis 36 as the depth gets larger in the first, second and third grooves 51, 52, 53. As shown in FIG. 9, when the first and second swinging members 35, 37 are held at the first rotation angle position, the inclined inside surface 71 is set at a predetermined angle from a tangent plane 73 tangential to an imaginary cylindrical surface 72 having the central axis on the fourth horizontal axis 46. In other words, the inclined inside surface 71 is located inside the tangent plane 73 when the imaginary cylindrical surface 72 touches the outer end of the inclined inside surface 71. The hook 48 is thus allowed to reliably engage the first groove 51. The torsion coil spring 49 serves to keep the engagement.

Figure 10:
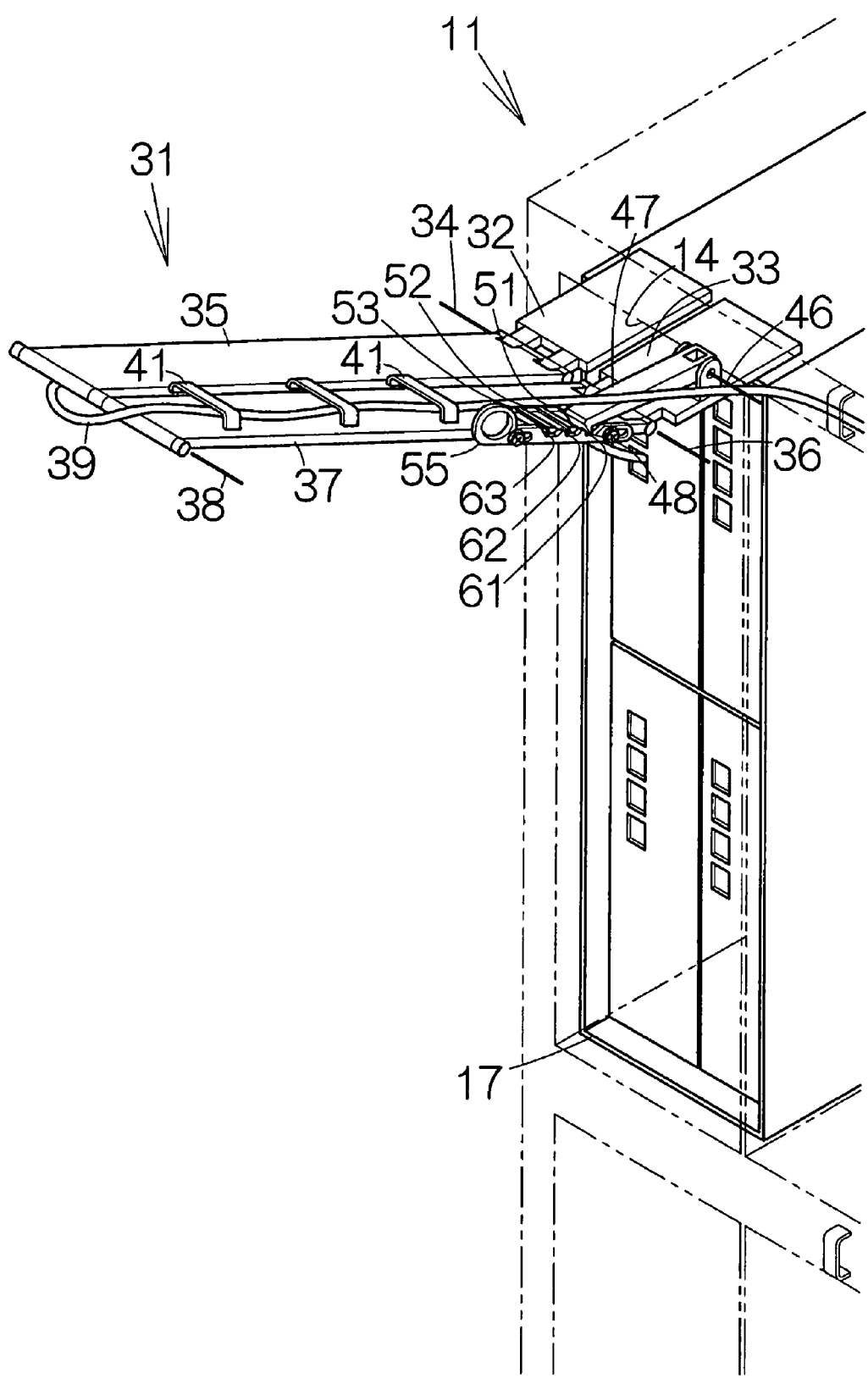
FIG. 10 is an enlarged partial perspective view schematically illustrating the stop member engaging with the engagement section.
Figure 11:
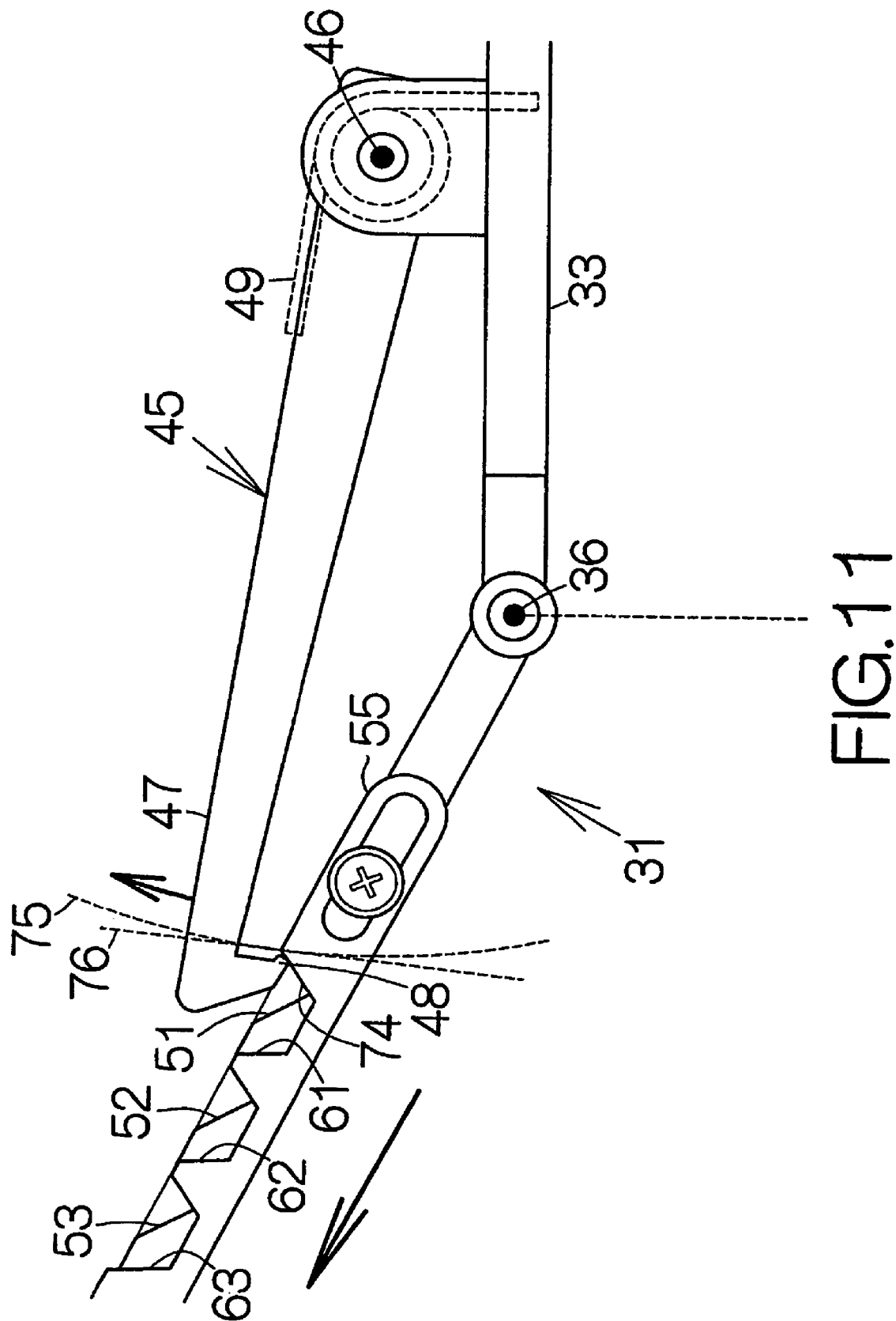
FIG. 11 is a further enlarged partial side view schematically illustrating the stop member being released from engagement with the engagement section.

As shown in FIG. 10, the rack mount unit 17 exposes its back surface. It is unnecessary for the maintenance worker to keep lifting up the first and second swinging members 35, 37 with a hand, since the locking mechanism 45 serves to hold the first and second swinging members 35, 37 at the first rotation angle position. The maintenance worker is able to perform maintenance work with both hands. Moreover, the hooks 41 serve to hold the wire 39 on the first and second swinging members 35, 37. The wire 39 is prevented from hindering the maintenance worker from the maintenance operation. The maintenance worker is able to easily perform the maintenance operation at the back of the rack mount unit 17. It is possible to shorten the maintenance.

After the maintenance, when the lock releasing lever 55 is moved toward the third horizontal axis 38, the lock releasing lever 55 moves toward the release position from the lock position. Here, the inclined inside surface 74 extending within the aforementioned inclined plane in the first recess 61 is forced to move across the opening of the corresponding first groove 51. The inclined inside surface 74 is set at a predetermined angle from a tangent plane 76 tangential to an imaginary cylindrical surface 75 having the central axis on the fourth horizontal axis 46. In other words, the inclined inside surface 74 is located outside the tangent plane 76 when the imaginary cylindrical surface 74 touches the outer end of the inclined inside surface 74.

Figure 12:
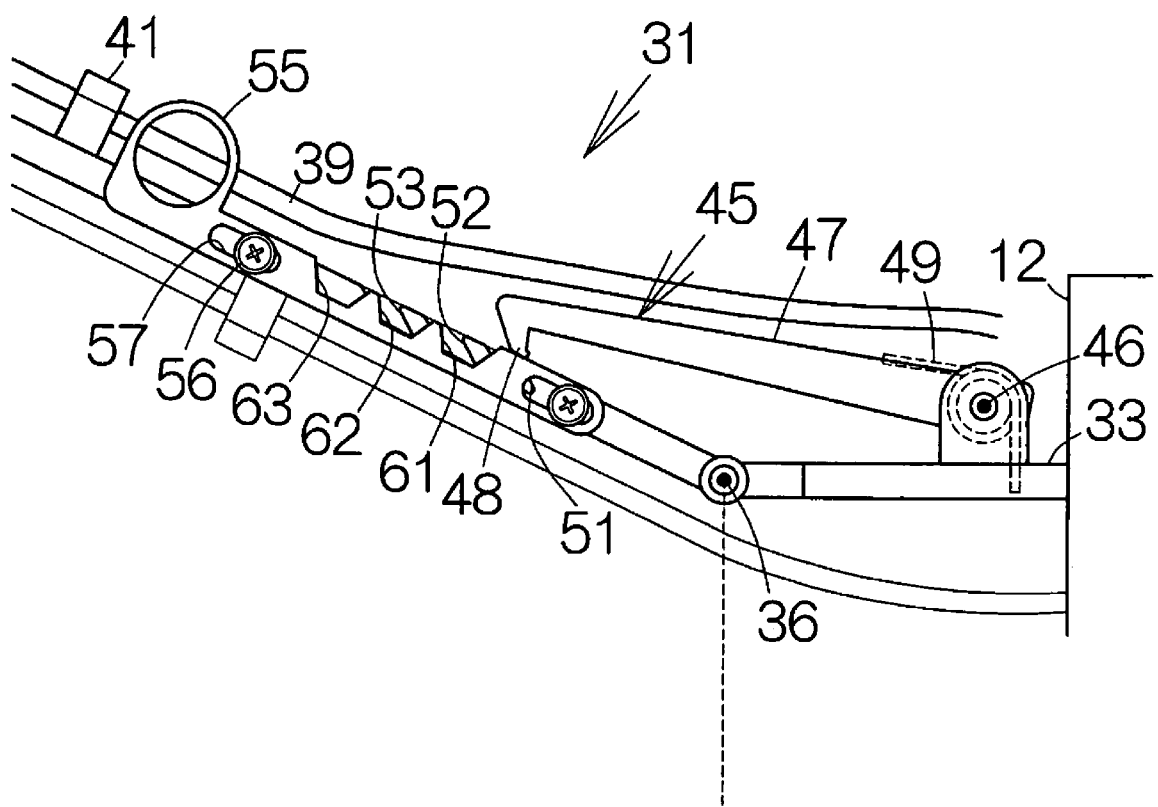
FIG. 12 is a further enlarged partial side view schematically illustrating the stop member completely released from engagement with the engagement section.

As the lock releasing lever 55 moves toward the release position, the hook 48 climbs up the inclined inside surface 74 at a position outside the first groove 51. When the lock releasing lever 55 reaches the release position, as shown in FIG. 12, the hook 48 moves outside the first groove 51. The engagement is thus released between the stop member 47 and the first groove 51. When the maintenance worker releases a finger from the lock releasing lever 55, the coil spring serves to restore the lock releasing lever 55 to the lock position. The maintenance worker thereafter swings back the first and second swinging members 35, 37 around the first and second horizontal axes 34, 36 until the first and second horizontal axes 34, 36 take attitudes in the direction of gravity.

When the first and second swinging members 35, 37 swing beyond the first rotation angle position around the first and second horizontal axes 34, 36, the hook 48 is received in the second groove 52 and the second recess 62. The stop member 47 is allowed to hold the first and second swinging members 35, 37 at the second rotation angle position. It is unnecessary for the maintenance worker to keep lifting up the first and second swinging members 35, 37 with a hand. The wire 39 is prevented from hindering the maintenance worker from the maintenance operation. The maintenance worker is able to easily perform the maintenance operation at the back of the rack mount unit 17.

The second swinging member 37 at the second rotation angle position allows the inclined inside surface in the second groove 52 to stay inside an imaginary cylindrical surface having the central axis on the fourth horizontal axis 46 when the cylindrical surface touches the outer end of the inclined inside surface of the second recess 62. The hook 48 is thus allowed to reliably engage the second groove 52. On the other hand, the lock releasing lever 55 in this case allows the inclined inside surface in the second recess 62 to stay outside a tangent plane tangential to an imaginary cylindrical surface having the central axis on the fourth horizontal axis 46 when the cylindrical surface touches the outer end of the inclined inside surface. Here, the first and second swinging members 35, 37 at the second rotation angle position take an attitude swinging around the first and second horizontal axes 34, 36 by 135 degrees from the direction of gravity, for example.

Figure 13:
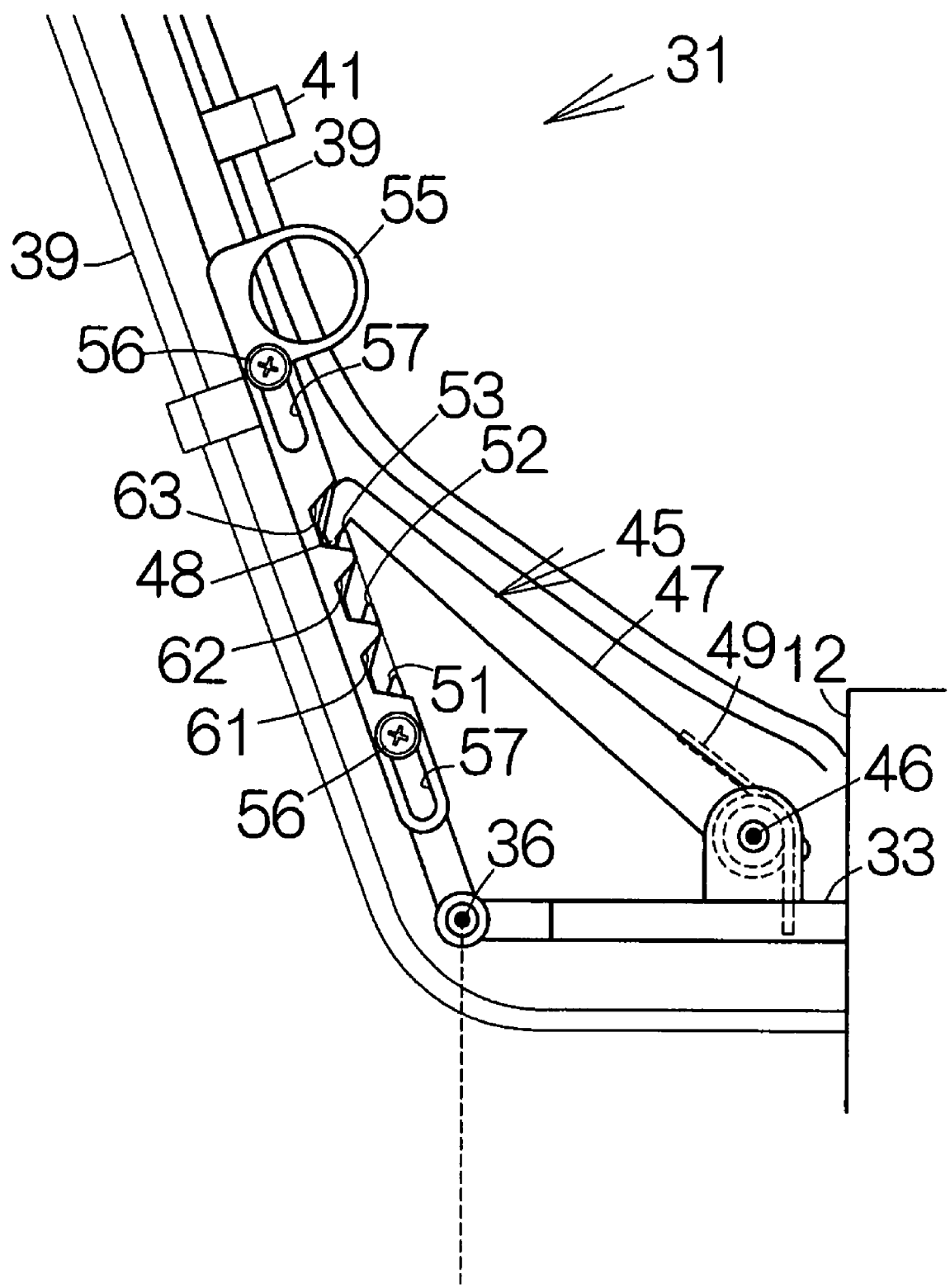
FIG. 13 is an enlarged partial side view schematically illustrating the stop member engaging with the engagement section.
Figure 14:
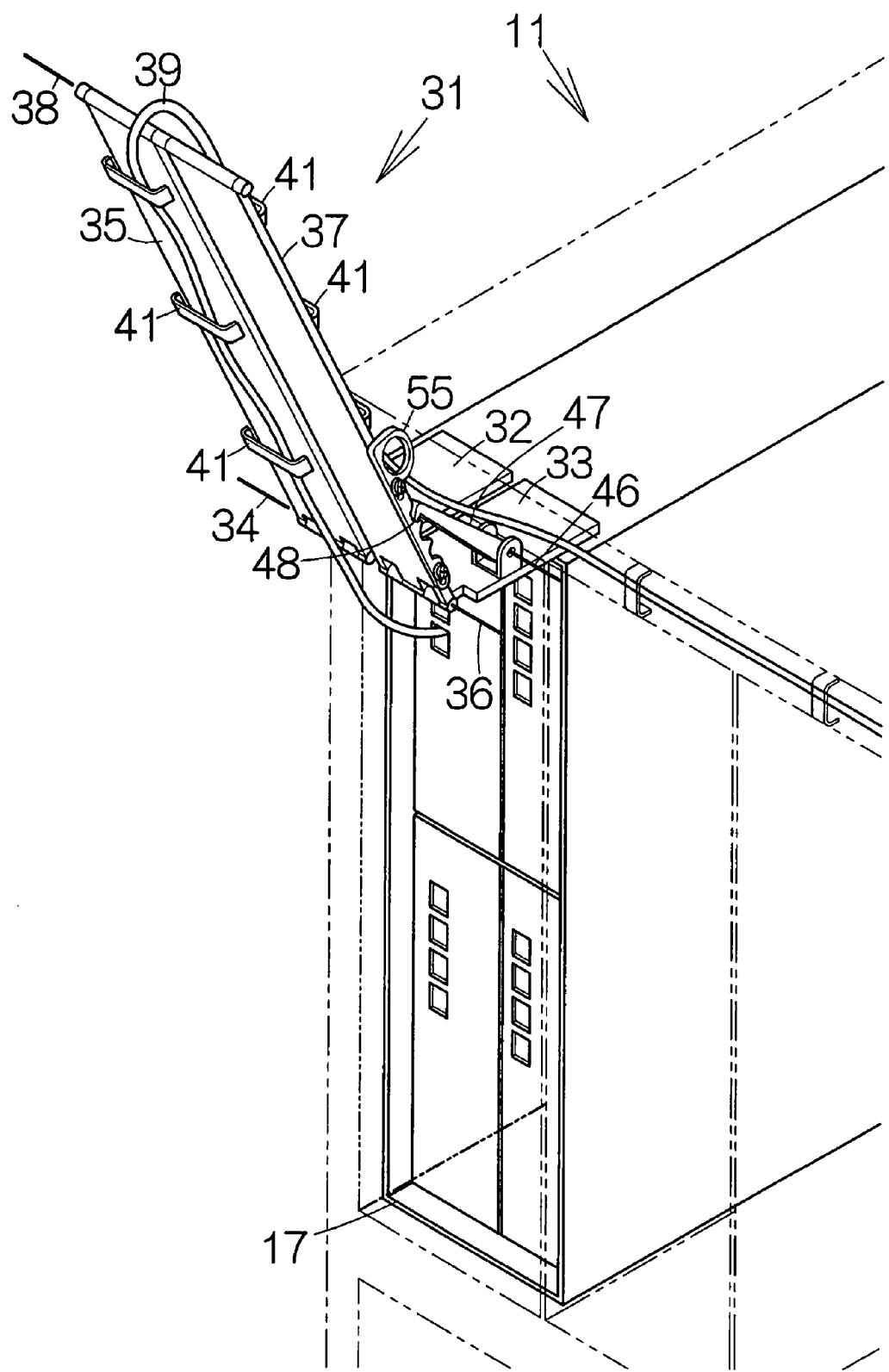
FIG. 14 is an enlarged partial perspective view schematically illustrating the stop member engaging with the engagement section.
Figure 15:
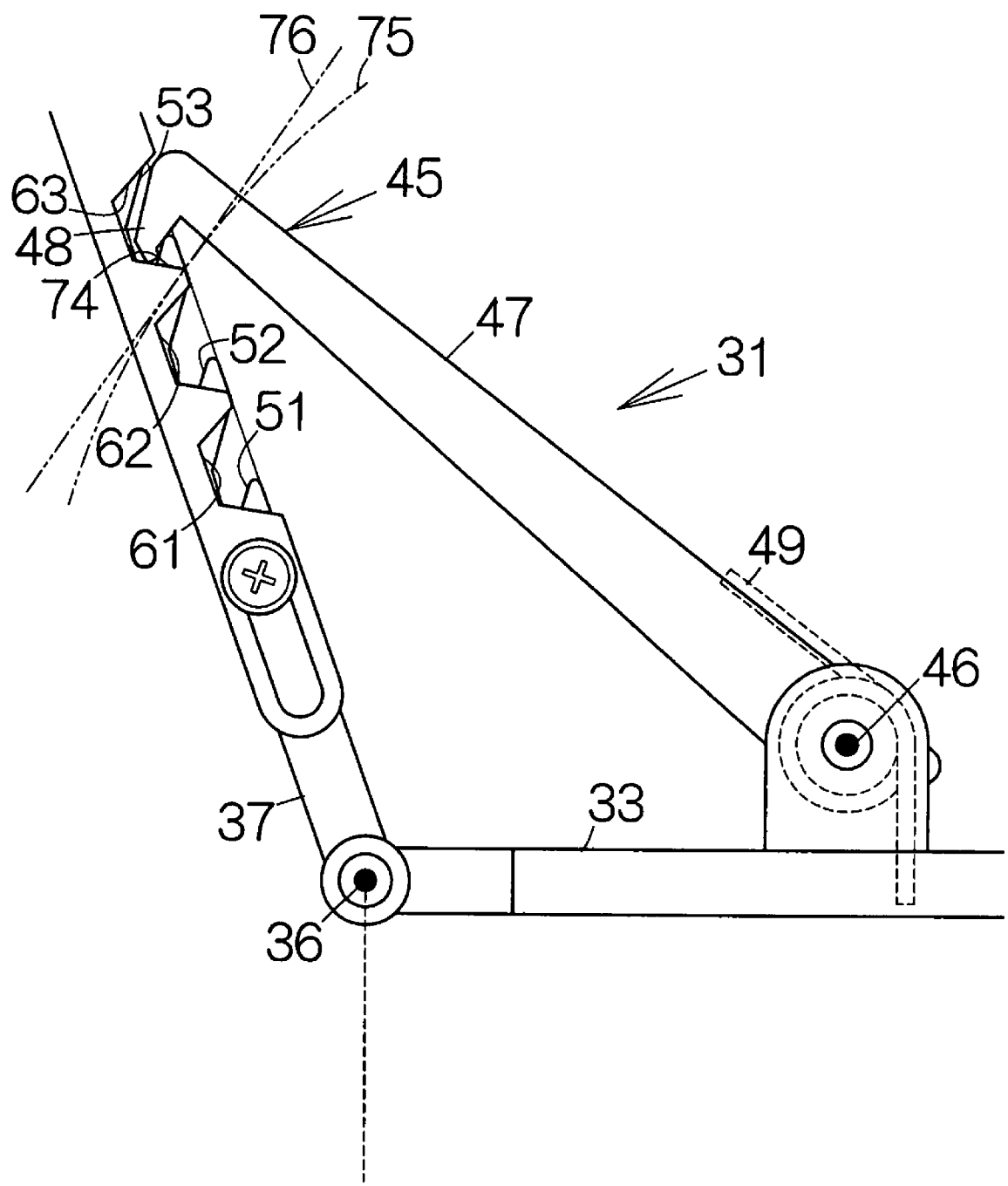
FIG. 15 is a further enlarged partial side view schematically illustrating the stop member engaging with the engagement section.

As shown in FIG. 13, when the first and second swinging members 35, 37 swings beyond the second rotation angle position around the first and second horizontal axes 34, 36, the hook 48 is received in the third groove 53 and the third recess 63. The stop member 47 is allowed to hold the first and second swinging members 35, 37 at the third rotation angle position. As shown in FIG. 14, the rack mount unit 17 exposes its back surface. It is unnecessary for the maintenance worker to holding the first and second swinging members 35, 37 with a hand. The wire 39 is prevented from hindering the maintenance worker from the maintenance operation. The maintenance worker is able to easily perform the maintenance operation at the back of the rack mount unit 17.

The second swinging member 37 at the third rotation angle position allows the inclined inside surface in the third groove 53 to stay inside an imaginary cylindrical surface having the central axis on the fourth horizontal axis 46 when the cylindrical surface touches the outer end of the inclined inside surface of the third recess 63. The hook 48 is thus allowed to reliably engage the third groove 53. On the other hand, the lock releasing lever 55 in this case allows the inclined inside surface 74 in the third recess 63 to stay outside a tangent plane tangential to an imaginary cylindrical surface 75 having the central axis on the fourth horizontal axis 46 when the imaginary cylindrical surface 75 touches the outer end of the inclined inside surface 74. Here, the first and second swinging members 35, 37 at the third rotation angle position take attitudes swinging around the first and second horizontal axes 34, 36 by an angle larger than 135 degrees from the direction of gravity, for example. This angle may be set at 160 degrees, for example.

The first and second swinging members 35, 37 swings around the first and second horizontal axes 34, 36 by the smallest amount of angle at the first rotation angle position in the aforementioned manner. Accordingly, the first and second swinging members 35, 37 should be set in the first rotation angle position when the disk array apparatus 13 is located in the upper level of the rack 12, for example. The first and second swinging members 35, 37 should be set in the second rotation angle position if the disk array apparatus 13 is located in the middle level of the rack 12, for example. The first and second swinging members 35, 37 should be set in the third rotation angle position if the disk array apparatus 13 is located in the lower position of the rack 12, for example. The first, second and third rotation angle positions may in this manner be selected in conformity with the attitude of a maintenance worker.

What is claimed is:

1. An electronic apparatus comprising:
a rack mount unit housed in a rack for forward movement along a horizontal plane, the forward movement enabling the rack mount unit to be pulled out of the rack;
a first swinging member connected to one of the rack mount unit and the rack for swinging movement around a first horizontal axis, the first swinging member extending in a direction of gravity at a back of the rack mount unit;
a second swinging member connected to other of the rack mount unit and the rack for swinging movement around a second horizontal axis, the second horizontal axis aligned with the first horizontal axis on a common straight line so that the first swinging member and the second swinging member rotate in a same direction around the common straight line when the rack mount unit is housed in the rack, the second swinging member extending in the direction of the gravity at the back of the rack mount unit, the second swinging member connected to the first swinging member for swinging movement around a third horizontal axis extending in parallel with the first horizontal axis at a position distanced from the first horizontal axis; a wire connected to the rack mount unit; holding members respectively received on the first and second swinging members to hold the wire on the first and second swinging members; and a locking mechanism designed to hold the second swinging member at a predetermined rotation angle position around the second horizontal axis when the rack mount unit is housed in the rack.

2. The electronic apparatus according to claim 1, wherein the locking mechanism further comprising a stop member attached to the one of the rack mount unit and the rack for engagement with the second swinging member.

3. The electronic apparatus according to claim 2, further comprising;
a first engagement section defined on the second swinging member for engagement with the stop member, the first engagement section designed to hold the second swinging member at an angle smaller than 135 degrees from the direction of gravity around the second horizontal axis; and
a second engagement section defined on the second swinging member for engagement with the stop member, the second engagement section designed to hold the second swinging member at an angle larger than 135 degrees from the direction of the gravity around the first horizontal axis.

4. The electronic apparatus according to claim 3, further comprising;
a lock releasing lever attached to the second swinging member for relative movement, the lock releasing lever contacting the stop member based on the relative movement so as to release the engagement between the first engagement section and the stop member and/or the engagement between the second engagement section and the stop member.

5. An in-rack electronic apparatus comprising:
a rack; and
an electronic apparatus mounted in the rack, wherein the electronic apparatus comprises:
a rack mount unit housed in the rack for forward movement along a horizontal plane, the forward movement enabling the rack mount unit to be pulled out of the rack;
a first swinging member connected to one of the rack mount unit and the rack for swinging movement around a first horizontal axis, the first swinging member extending in a direction of gravity at a back of the rack mount unit;
a second swinging member connected to other of the rack mount unit and the rack for swinging movement around a second horizontal axis, the second horizontal axis aligned with the first horizontal axis on a common straight line so that the first swinging member and the second swinging member rotate in a same direction around the common straight line when the rack mount unit is housed in the rack, the second swinging member extending in the direction of the gravity at the back of the rack mount unit, the second swinging member connected to the first swinging member for swinging movement around a third horizontal axis extending in parallel with the first horizontal axis at a position distanced from the first horizontal axis;
a wire connected to the rack mount unit; holding members respectively received on the first and second swinging members to hold the wire on the first and second swinging members; and
a locking mechanism designed to hold the second swinging member at a predetermined rotation angle position around the second horizontal axis when the rack mount unit is housed in the rack.

* * * * *